United States Patent
Fijikawa

[11] Patent Number: 6,159,848
[45] Date of Patent: Dec. 12, 2000

[54] METHOD OF MANUFACTURING A SEMICONDUCTOR DEVICE HAVING A HIGH MELTING POINT METAL FILM

[75] Inventor: Hiroharu Fijikawa, Miyazaki, Japan

[73] Assignee: Oki Electric Industry Co., Ltd., Tokyo, Japan

[21] Appl. No.: 09/316,035

[22] Filed: May 21, 1999

[30] Foreign Application Priority Data

Feb. 2, 1999 [JP] Japan .................................. 11-025094

[51] Int. Cl.⁷ ............................ H01L 21/44; H01L 21/48
[52] U.S. Cl. ......................... 438/660; 438/658; 438/659; 438/680
[58] Field of Search .................. 438/659, 660, 438/680, 658

[56] References Cited

U.S. PATENT DOCUMENTS

| | | | |
|---|---|---|---|
| 4,631,804 | 12/1986 | Roy | 29/576 |
| 5,480,836 | 1/1996 | Harada et al. | 437/192 |
| 5,882,738 | 3/1999 | Blish, II et al. | 427/526 |

FOREIGN PATENT DOCUMENTS

| | | |
|---|---|---|
| 60-32361 | 2/1985 | Japan . |
| 2-250319 | 10/1990 | Japan . |
| 4-305933 | 10/1992 | Japan . |
| 8-97212 | 4/1996 | Japan . |
| 8-241895 | 9/1996 | Japan . |
| 9-36113 | 2/1997 | Japan . |

Primary Examiner—Charles Bowers
Assistant Examiner—Lisa Kilday
Attorney, Agent, or Firm—Jones Volentine, LLC

[57] ABSTRACT

An object of the present invention is to provide a method of manufacturing a semiconductor device, which is capable of reducing metal-film stress produced upon formation of a high melting-point metal film by Chemical Vapor Deposition (CVD) and is very good in controllability. A typical invention of the present application is intended for the implantation of ions of an inert gas in the high melting-point metal film after deposition of the high melting-point metal film over a semiconductor wafer by CVD. According to the typical invention of the present application, since warpage of the semiconductor wafer due to the high melting-point metal film can be reduced, a failure in focus can be reduced in a patterning process for forming the subsequent interconnections, particularly an exposure process using a stepper. Accordingly, interconnections having desired dimensions can be formed.

5 Claims, 2 Drawing Sheets

METHOD OF MANUFACTURING A SEMICONDUCTOR DEVICE HAVING A HIGH MELTING POINT METAL FILM

BACKGROUND OF THE INVENTION

1. Field of the Invention

This invention relates to a method of manufacturing a semiconductor device, and particularly to a method of manufacturing a semiconductor device, which is capable of reducing metal-film stress produced when a high melting-point metal film is formed by Chemical Vapor Deposition.

2. Description of the Related Art

There has heretofore been increasingly a demand for speeding up and micro-fabrication of a semiconductor device. As means for meeting this demand, it is known that a high melting-point metal (i.e., a refactory metal) is used for gate electrodes and conductive lines for the semiconductor device.

For example, a technique is known in which tungsten deposited by Chemical Vapor Deposition (abbreviated as "CVD") is used for conductive lines or interconnections.

It is known that a high melting-point metal film typified by such tungsten has strong tensile stress. This stress becomes more and more conspicuous due to heat treatment or the like after the formation of the high melting-point metal film.

As the tensile stress becomes great, a semiconductor wafer with the high melting-point metal film formed thereon increases in warpage. With the increase in the amount of warpage of the wafer, a deviation in focus occurs in a patterning process for forming conductive lines or interconnections, particularly an exposure process using a stepper, thus creating a difficulty in the formation of conductive lines or interconnections having desired dimensions. This problem remarkably occurs in a peripheral portion of the semiconductor wafer, which is most affected by the amount of warpage thereof.

As a method of solving the above difficulty, implantation of tungsten ions in a deposited tungsten film has been proposed in Japanese Patent Application Laid-Open No. Hei 8-97212 opened to the public in Apr. 12, 1996.

However, since metal ions typified by the tungsten ions are large in mass, controllability is very poor. Namely, it is very difficult to implant ions in a desired portion of a thin metal film.

SUMMARY OF THE INVENTION

With the foregoing in view, it is therefore an object of the present invention to provide a method of manufacturing a semiconductor device, which is capable of reducing metal-film stress produced upon formation of a high melting-point metal film by CVD and is very good in controllability.

According to one aspect of the invention, for achieving the above object, there is provided a method of manufacturing a semiconductor device, comprising the following steps of depositing a high melting-point metal film over a semiconductor wafer by CVD, and thereafter implanting ions of an inert gas in the high melting-point metal film.

According to the present invention, since warpage of the semiconductor wafer due to the high melting-point metal film can be reduced, a deviation (failure) in focus can be reduced in a patterning process for forming the subsequent conductive lines or interconnections, particularly an exposure process using a stepper. Accordingly, conductive lines or interconnections having desired dimensions can be formed. Further, since the ions of inert gas are used, the present invention can provide very good controllability. Namely, since the inert gas is much smaller in mass than a metal ion or the like, the ions can be implanted in a desired portion of a thin metal film.

Further, since the inert gas is a very stable gas, no influence is exerted on a film adjacent to the high melting-point metal film even if atoms of the inert gas flow out into the adjacent film. When the adjacent film is a titanium nitride film and nitrogen are implanted in the high melting-point metal film formed over the titanium nitride film, for example, it is also considered the implanted nitrogen atoms will flow out in the adjacent titanium nitrogen film. In this case, it is also considered that the nitrogen atoms increase in concentration at a titanium nitride-film interface, particularly a high melting-point metal-film interface and the titanium nitride film rises in resistance.

According to the present invention, even if the atoms of the inert gas are discharged into the film adjacent to the high melting-point metal film, no influence is exerted on the adjacent film.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

A preferred embodiment of the present invention will hereinafter be described with reference to the accompanying drawings. FIG. 1 is a cross-sectional view showing a method of manufacturing a semiconductor device, according to the present invention.

Figure 1A:
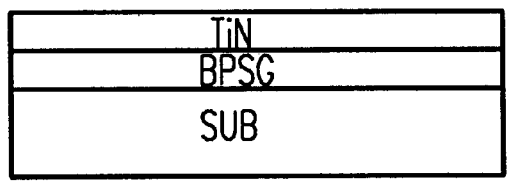
FIGS. 1(A–C) are a cross-sectional view showing a method of manufacturing a semiconductor device, according to the present invention.

As shown in FIG. 1(A), an interlayer insulating film BPSG and a titanium nitride film TiN are formed over a semiconductor wafer SUB. The semiconductor wafer might be also referred to as a semiconductor substrate. The interlayer insulating film BPSG is an insulating film doped with boron and phosphorus and is formed with a thickness of about 5000 Å. The titanium nitride film TiN is a film used as a barrier metal and is formed with a thickness of about 500 Å.

Figure 1B:
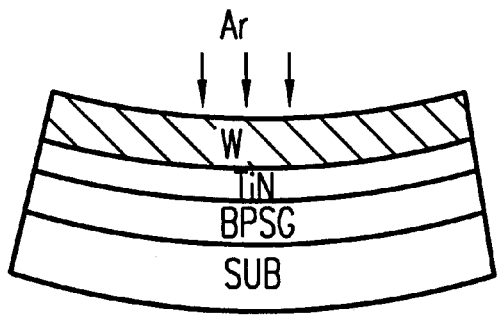

Next, a tungsten film W is formed over the titanium nitride film TiN with a thickness of 4500 Å by CVD as shown in FIG. 1(B). The tungsten film W has a tensile stress of about $9.3 \times 10^9$ dyn/cm$^2$. In the case of a semiconductor wafer having a size of 6 inches, the amount of warpage of the semiconductor wafer due to this stress is about 125 um. This warpage corresponds to warpage taken as concave with respect to the semiconductor wafer as shown in FIG. 1(B).

Figure 1C:
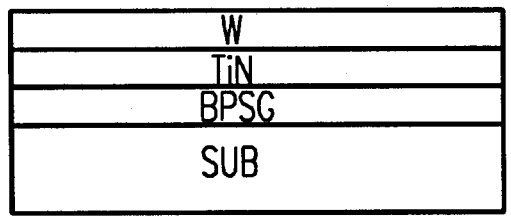

Now, ions of argon Ar are implanted in the tungsten film W under conditions of an accelerating energy of 40 kev and a dose of $2.0 \times 10^{15}$ cm$^{-2}$. As a result, the stress of the tungsten film W is lightened to about $5.6 \times 10^9$ dyn/cm$^2$ as shown in FIG. 1(C). As a result, the amount of warpage of the semiconductor wafer is reduced to about 90 um in the case of the wafer having the size of 6 inches.

With the implantation of the ions of argon Ar, the sheet resistance of the tungsten film W rises. When the rise in the sheet resistance shows a problem, the tungsten film may be heat-treated after the aforementioned process.

This heat treatment is lamp anneal (N$_2$ anneal) in an atmosphere of nitrogen and is executed under conditions of a temperature of 800° C., a nitrogen's flow rate of 10 l/min, and a time interval of 60 seconds.

While the present embodiment has been described using tungsten and argon as a metal having a high melting point and an inert gas respectively, other high melting-point metals and inert gases may be used. It is considered that, for example, Ne, Kr, Xe, Rn, Kn, etc. are used as other inert gases. Since argon is an inert gas which is put to the most use in this field and is easy to get and work with, it has been used in the description of the present embodiment.

According to the inventor's knowledge or findings, the gases large in atomic weight, of the inert gases have been considered to contribute to lightening of the tensile stress of each high melting-point metal film.

Figure 2:
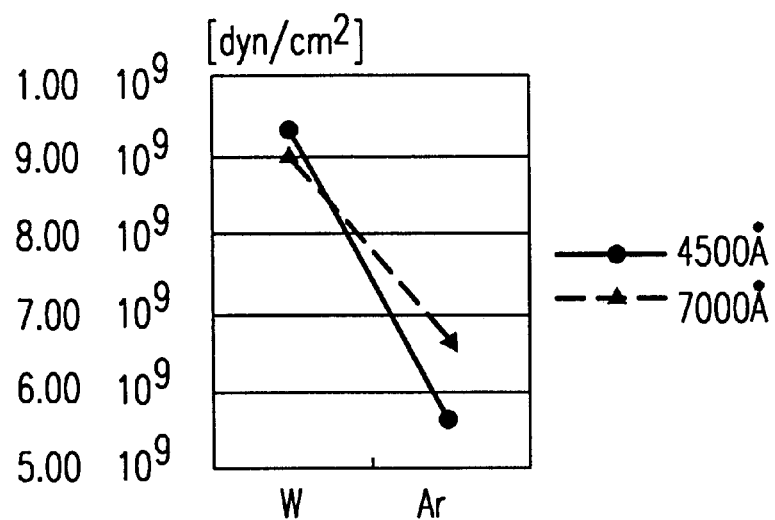
FIG. 2 is a plot illustrating changes in tensile stress of a tungsten film before and after the implantation of argon ions therein.

FIG. 2 shows changes in tensile stress of a tungsten film before and after the implantation of argon ions therein. The vertical axis of the present drawing shows the tensile stress (dyn/cm$^2$). W on the horizontal axis thereof indicates a tensile stress before the ion implantation and Ar on the horizontal axis thereof indicates a tensile stress after the ion implantation. Changes in the tensile stress at the time that the tungsten has tungsten film-thicknesses of 4500 Å and 7000 Å, are shown in the drawing. In the drawing, the tungsten film 4500 Å in thickness is marked with black circles (●), whereas the tungsten film 7000 Å in thickness is marked with black triangles (▲).

While the tungsten film having the thickness of 4500 Å shows a tensile stress of $9.31 \times 10^9$ dyn/cm$^2$ before the implantation of the argon ions, the tungsten film is reduced to a tensile stress of $5.67 \times 10^9$ dyn/cm$^2$ after the implantation of the argon ions.

While the tungsten film having the thickness of 7000 Å shows $8.92 \times 10^9$ dyn/cm$^2$ before the implantation of the argon ions, the tungsten film is reduced to a tensile stress of $6.69 \times 10^9$ dyn/cm$^2$.

Thus, the ion implantation allows a reduction in the tensile stress of the tungsten film.

Figure 3:
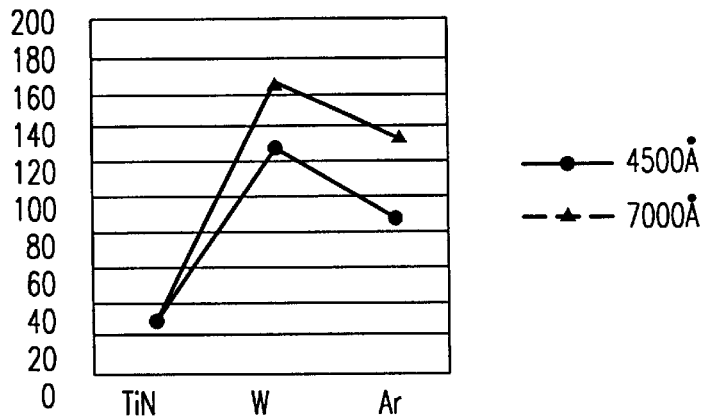
FIG. 3 is a plot depicting the amounts of warpage of a semiconductor wafer at the time that a titanium nitride film is formed, a tungsten film is formed over the titanium nitride film, and the argon ions are implanted in the tungsten film.

FIG. 3 shows the amounts of warpage of a semiconductor wafer at the time that a titanium nitride film is formed, a tungsten film is formed over the titanium nitride film and argon ions are implanted in the tungsten film, respectively.

The vertical axis in the drawing indicates the amount of warpage (um) of the semiconductor wafer. TiN on the horizontal axis indicates a case in which the titanium nitride film is formed over the semiconductor wafer, W on the horizontal axis indicates a case in which the tungsten film is formed over the titanium nitride film, and Ar on the horizontal axis indicates a case in which the argon ions are implanted in the tungsten film, respectively. Changes in the amount of warpage at the time that the tungsten has tungsten film-thicknesses of 4500 Å and 7000 Å, are shown. In the drawing, the tungsten film 4500 Å in thickness is marked with black circles (●), whereas the tungsten film 7000 Å in thickness is marked with black triangles (▲).

A description will first be made of the case in which the tungsten 4500 Å in thickness is formed. When the titanium nitride film is formed over the semiconductor wafer, the amount of warpage of the semiconductor wafer indicates 36 um. When the tungsten film having the thickness of 4500 Å is formed over the tungsten film, the amount of warpage of the semiconductor wafer indicates 125 um. Thereafter, the amount of warpage of the semiconductor wafer is reduced to 90 um when the argon ions are implanted in the tungsten film.

A description will next be made of the case in which the tungsten film having the thickness of 7000 Å is formed. When the titanium nitride film is formed over the semiconductor wafer, the amount of warpage of the semiconductor wafer indicates 36 um. When the tungsten film having the thickness of 7000 Å is formed over the titanium nitride film, the amount of warpage of the semiconductor wafer indicates 167 um. Thereafter, when the argon ions are implanted in the tungsten film, the amount of warpage of the wafer is reduced to 134 um.

By implanting the argon ions in the tungsten film in this way, the amount of warpage of the semiconductor wafer is greatly reduced.

Figure 4:
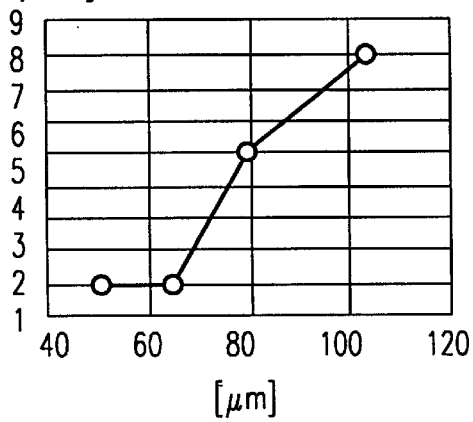
FIG. 4 is a plot showing the relationship between the amount of warpage of the semiconductor wafer and defocusing in an exposure process.

FIG. 4 shows the relationship between the amount of warpage of the semiconductor wafer and a failure in focus or defocusing in an exposure process. The vertical axis in FIG. 4 indicates the number of failures in focus or defocuses (Shot/waf) per semiconductor wafer and the horizontal axis in FIG. 4 indicates the amount of warpage (um) of the semiconductor wafer.

As shown in FIG. 4, the number of defocuses at the time that the amount of warpage is 50 um, is equal to 1, the number of defocuses at the time that the amount of warpage is 65 um, is equal to 1, the number of defocuses at the time that the amount of warpage is 80 um, is equal to 5, and the number of defocuses at the time that the amount of warpage is 105 um, is equal to 8, respectively. Thus, when the amount of warpage reaches 65 um or more, the number of defocuses greatly increases.

It is desirable that the amount of warpage of the semiconductor wafer is controlled to less than at least 65 um to reduce the defocusing to the utmost.

Thus, the implantation of the ions of the inert gas in the high melting-point metal is very effective in reducing the amount of warpage of the semiconductor wafer as typified by the implantation of the argon ions in the tungsten film as described above.

The rise in the sheet resistance of the tungsten film due to the implantation of the argon ions, and the subjection of the tungsten film to the heat treatment when the rise in the sheet resistance shows the problem, have been described previously. The effect of the tungsten film by the heat treatment will be explained below with reference to FIG. 5.

Figure 5:
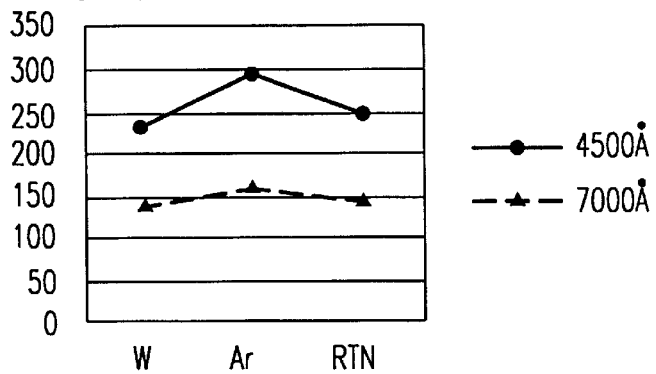
FIG. 5 is a plot illustrating a change in the sheet resistance of the tungsten film at the time that the tungsten film is formed, a change in the sheet resistance of the tungsten film at the time that the argon ions are implanted in the tungsten film, and a change in the sheet resistance of the tungsten film at the time that the tungsten film is heat-treated after the ion implantation.

FIG. 5 show a change in the sheet resistance of the tungsten film at the time that the tungsten film is formed, a change in the sheet resistance of the tungsten film at the time that the argon ions are implanted in the tungsten film, and a change in the sheet resistance of the tungsten film at the time that the tungsten film is heat-treated after the ion implantation.

The vertical axis in the drawing indicates the sheet resistance (m Ω/□) of the tungsten film. W on the horizontal axis indicates the sheet resistance at the formation of the tungsten film, Ar on the horizontal axis indicates the sheet resistance at the time that the argon ions are implanted in the tungsten film, and RTN on the horizontal axis indicates the sheet resistance of the tungsten film subjected to heat treatment.

Here, changes in the sheet resistance at the time that the tungsten has tungsten film-thicknesses of 4500 Å and 7000 Å, are shown. In the drawing, the tungsten film 4500 Å in thickness is marked with black circles (●), whereas the tungsten film 7000 Å in thickness is marked with black triangles (▲).

A description will first be made of the case in which the tungsten film 4500 Å in thickness is formed. When the tungsten film having the thickness of 4500 Å is formed, the sheet resistance of the tungsten film indicates 230 m Ω/□. When the argon ions are thereafter implanted in the tungsten film, the sheet resistance thereof indicates 296 m Ω/□. Thereafter, when the tungsten film is heat-treated under conditions of a temperature of 800° C., a nitrogen's flow rate of 10 l/min, and a time interval of 60 seconds in a nitrogen atmosphere, the sheet resistance of the tungsten film indicates 249 m Ω/□. When the tungsten film is subjected to heat treatment under conditions of a temperature of 500° C., the nitrogen's flow rate of 10 l/min and the time interval of 60 seconds in the nitrogen atmosphere, the sheet resistance thereof indicates 279 m Ω/□ although not shown in the drawing.

A description will next be made of the case in which the tungsten film 7000 Å in thickness is formed. When a tungsten film of 7000 Å is formed, the sheet resistance of the tungsten film indicates 136 m Ω/□. Thereafter, when the argon ions are implanted in the tungsten film, the sheet resistance of the tungsten film indicates 161 m Ω/□. Thereafter, when the tungsten film is heat-treated under conditions of the temperature of 800° C., the nitrogen's flow rate of 10 l/min, and the time interval of 60 seconds in the nitrogen atmosphere, the sheet resistance of the tungsten film indicates 142 m Ω/□. When the tungsten film is subjected to heat treatment under conditions of the temperature of 500° C., the nitrogen's flow rate of 10 l/min and the time interval of 60 seconds in the nitrogen atmosphere, the sheet resistance thereof indicates 155 m Ω/□ although not shown in the drawing.

Thus, when the argon ions are implanted in the tungsten film, the sheet resistance of the tungsten film rises. When the rise in the sheet resistance shows a problem, the sheet resistance can be reduced as described above by subjecting the tungsten film to heat treatment.

According to the present invention as has been described above, since the warpage of the semiconductor wafer due to the high melting-point metal film can be reduced, a deviation (failure) in focus can be reduced in a patterning process for forming the subsequent interconnections, particularly an exposure process using a stepper.

Accordingly, conductive lines or interconnections having desired dimensions can be formed. Further, since the ions of the inert gas are used, the present invention can provide very good controllability. Namely, since the inert gas is much smaller in mass than a metal ion or the like, the ions can be implanted in a desired portion of a thin metal film.

While the sheet resistance of the high melting-point metal film rises with ion implantation, the sheet resistance can be reduced by heat treatment where the rise in the sheet resistance shows a problem.

Since the inert gas employed in the present invention is a very stable gas, no influence is exerted on a film adjacent to the high melting-point metal film even if atoms of the inert gas flow out into the adjacent film. When the adjacent film is a titanium nitride film as described above and nitrogen ions or the like are implanted in the high melting-point metal film formed over the titanium nitride film, it is also considered that the implanted nitrogen atoms will flow out in the adjacent titanium nitrogen film. In this case, it is also considered that the nitrogen atoms increase in concentration at a titanium nitride-film interface, particularly a high melting-point metal-film interface and the titanium nitride film rises in resistance. In the present invention, even if the atoms of the inert gas are discharged into the film adjacent to the high melting-point metal film, no influence is exerted on the adjacent film.

According to the present invention, since the warpage of the semiconductor wafer due to the high melting-point metal film can be reduced, a failure in focus or defocusing can be reduced in a patterning process for forming the subsequent interconnections, particularly an exposure process using a stepper. Accordingly, conductive lines or interconnections having desired dimensions can be formed. Further, since the ions of the inert gas are used, the present invention can provide very good controllability. Namely, since the inert gas is much smaller in mass than a metal ion or the like, the ions can be implanted in a desired portion of a thin metal film.

Further, since the inert gas is a very stable gas, no influence is exerted on a film adjacent to the high melting-point metal film even if atoms of the inert gas flow out into the adjacent film.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method of manufacturing a semiconductor device, comprising:

forming a refractory metal film over a semiconductor wafer; and thereafter introducing ions of an inert gas into said refractory metal film to reduce warpage of said semiconductor wafer, wherein the warpage of said semiconductor wafer falls within ±65 μm with respect to the surface of said semiconductor wafer.

2. The method according to claim 1, wherein said refractory metal film is heat-treated in a nitrogen atmosphere after said ion introduction to reduce the resistance of said refractory metal film.

3. The method according to claim 1, wherein said refractory metal film is a tungsten film and said inert gas is argon.

4. The method according to claim 1, wherein said refractory metal film is a tungsten film, and wherein after an insulating film is formed over said semiconductor wafer and a titanium nitride film is formed over the insulating film, the tungsten film is formed over the titanium nitride film.

5. The method according to claim 2, wherein said heat treatment is carried out at a temperature of 500° C. or more for 60 seconds or more.

* * * * *